United States Patent
Wang

(10) Patent No.: US 8,357,983 B1
(45) Date of Patent: Jan. 22, 2013

(54) HALL EFFECT ELEMENT HAVING A WIDE CROSS SHAPE WITH DIMENSIONS SELECTED TO RESULT IN IMPROVED PERFORMANCE CHARACTERISTICS

(75) Inventor: Yigong Wang, Rutland, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 13/198,303

(22) Filed: Aug. 4, 2011

(51) Int. Cl.
*H01L 29/82* (2006.01)

(52) U.S. Cl. ........ 257/427; 257/257; 257/421; 257/422; 257/425

(58) Field of Classification Search .................. 257/427, 257/421, 422, 425
See application file for complete search history.

(56) References Cited

U.S. PATENT DOCUMENTS

| | | | |
|---|---|---|---|
| 5,652,445 A | 7/1997 | Johnson | |
| 6,630,882 B1* | 10/2003 | Heremans et al. | 338/32 H |
| 6,727,563 B1* | 4/2004 | Sauerer et al. | 257/427 |
| 6,800,913 B2* | 10/2004 | Johnson et al. | 257/421 |
| 7,339,245 B2 | 3/2008 | Mueller | |
| 7,372,119 B2* | 5/2008 | Nakamura et al. | 257/427 |
| 7,847,536 B2* | 12/2010 | Haddab et al. | 324/117 H |
| 7,872,322 B2 | 1/2011 | Schott et al. | |
| 7,936,029 B2 | 5/2011 | Wang | |
| 2011/0147865 A1* | 6/2011 | Erie et al. | 257/421 |

* cited by examiner

*Primary Examiner* — Eugene Lee
(74) *Attorney, Agent, or Firm* — Daly, Crowley, Mofford & Durkee, LLP

(57) ABSTRACT

A Hall effect element includes a Hall plate having geometric features selected to result in a highest ratio of a sensitivity divided by a plate resistance. The resulting shape is a so-called "wide-cross" shape.

17 Claims, 5 Drawing Sheets

HALL EFFECT ELEMENT HAVING A WIDE CROSS SHAPE WITH DIMENSIONS SELECTED TO RESULT IN IMPROVED PERFORMANCE CHARACTERISTICS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to Hall effect magnetic field sensing elements and, more particularly, to a Hall effect element having a Hall plate with particular shape and other characteristics selected to result in improved performance characteristics.

BACKGROUND OF THE INVENTION

Hall effect magnetic field sensing elements are known. As is known, a Hall effect element includes a so-called "Hall plate," which is most often an epi region (i.e., layer) upon a substrate. An epi region will be understood to have a medium amount of doping, described more fully below. Above the epi region is a field plate having generally the same outline or perimeter as the Hall plate. The field plate is made of metal or polysilicon. Between the Hall plate and the field plate is disposed an isolation layer, for example, a field oxide or a nitride layer.

Referring to FIG. 1, a conventional square Hall effect element 10 has a square perimeter 14. A cross section of the Hall effect element 10 will be understood by those of ordinary skill in the art, but is the same as or similar to a cross section shown in FIG. 4.

The conventional square Hall effect element 10 has four electrical contacts 12a-12d. As is known, in operation, a voltage is applied to opposite electrical contacts, e.g., 12a and 12c, (or, more particularly, to metal upon the electrical contacts) and an output voltage proportional to a magnetic field experienced by the Hall effect element 10 is generated between the other opposite electrical contacts, e.g., 12b and 12d.

In some arrangements, the Hall effect element 10 is used in a so-called "chopped" arrangement by associated electronics. In the chopped arrangement, sequentially, different sets of opposing electrical contacts are selected to drive the Hall effect element and output signals are received from the other sets of opposing electrical contacts. The resulting several output signals are averaged or in some other way combined. The resulting combined signal tends to have less offset voltage than any one output signal taken alone.

The perimeter 14 is representative of both a perimeter of the Hall plate, i.e., epi region, and also a perimeter of the field plate. A boundary 16 is representative of a field oxide extension beyond the edge of the perimeter 14.

Referring now to FIG. 2, a conventional cross-shaped Hall effect element 20 has a cross-shaped perimeter 22. It will be apparent that a conventional cross-shaped perimeter 22 has particular shape characteristics. For example, the perimeter 22 has four indented regions of which an indented region 28 is but one example. Taking the indented region 28 as representative of all of the indented regions, the indented region 28 has two sides 30, 32 forming a V-shape. An angle 34 between the two sides 30, 32 is ninety degrees. The cross-shaped perimeter 22 also has four corner regions, for example, a corner region 24 comprising two sides 24a, 24b, each side with a length 26. The cross-shaped perimeter 22 also has a square central core region 36. Lengths of the sides of the central core region 36, represented by a dimension 38, are each the same as a width of one of the arms of the cross.

The conventional cross-shaped Hall effect element 20 has four electrical contacts 38a-38d. Operation of the Hall effect element 20 is the same as or similar to operation of the Hall effect element 10 of FIG. 1.

In general, the cross-shaped Hall effect element 20 has certain advantages when compared with the square Hall effect element 10 of FIG. 1. In particular, the cross-shaped Hall effect element 20 of similar size to the square Hall effect element 10 uses less area than the square Hall effect element 10 of FIG. 1. Less area can result in higher device yield and also a smaller die on which the Hall effect element 20 is disposed, particularly when combined with other component on the same substrate. Less area also tends to result in lower capacitance, which tends to reduce response time.

In contrast, the square Hall effect element 10 of FIG. 1 has certain advantages when compared with the cross-shaped Hall effect element 20. In particular, the square Hall effect element 10 of similar size to the cross-shaped Hall effect element 20 has both higher sensitivity to magnetic fields and also a lower resistance between opposing electrical contacts.

It would be desirable to have a Hall effect element that has all of the above-listed advantages, namely, a smaller area than a square Hall effect element, good sensitivity and low resistance like a square Hall effect element, with low capacitance and fast response time like the cross-shaped Hall effect element.

SUMMARY OF THE INVENTION

The present invention provides a Hall effect element having a shape selected to result in a smaller area than a square Hall effect element, while retaining good sensitivity and low resistance like a square Hall effect element.

In accordance with one aspect of the present invention, a Hall effect element includes a substrate comprised of a material with a selected Miller index of (100). The Hall effect element also includes a Hall plate comprised of epi material disposed on a surface of the substrate. The Hall plate includes a major planar surface that has an outer perimeter bounded by a square outer boundary. The square outer boundary has four sides with first lengths. Four longest sides of the outer perimeter are tangent to the four sides of the square outer boundary. Two of the four longest sides of the outer perimeter are parallel to a [011] Miller direction and another different two of the four longest sides of the outer perimeter are orthogonal to the [011] Miller direction. The outer perimeter includes four inner corners, each having a respective two orthogonal sides meeting at a respective vertex. For each inner corner, vectors taken along the respective two orthogonal sides and pointing toward the respective vertex point inward toward the Hall plate. A first line taken between vertices of a first pair of opposing inner corners is at an angle of forty five degrees relative to the [011] Miller direction and a second line taken between vertices of a second pair of opposing inner corners is orthogonal to the first line. The major planar surface further includes a square core region bounded by lines joining adjacent ones of the vertices of the four inner corners. The square core region has four sides with second lengths. The major planar surface also includes four electrical contacts. Each electrical contact is in electrical communication with the Hall plate. Each electrical contact has a respective center, a respective length, and a respective width. A third line and a fourth line drawn between the centers of respective opposing ones of the electrical contacts have third lengths. The third line is parallel to the [011] Miller direction and the fourth line is orthogonal to the third line. A first ratio corresponding to the third lengths divided by the second lengths is in a range of about 1.1 to about 1.4.

With this arrangement, the Hall effect element is neither a square Hall effect element nor a conventional simple cross-shaped Hall effect element.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 3:
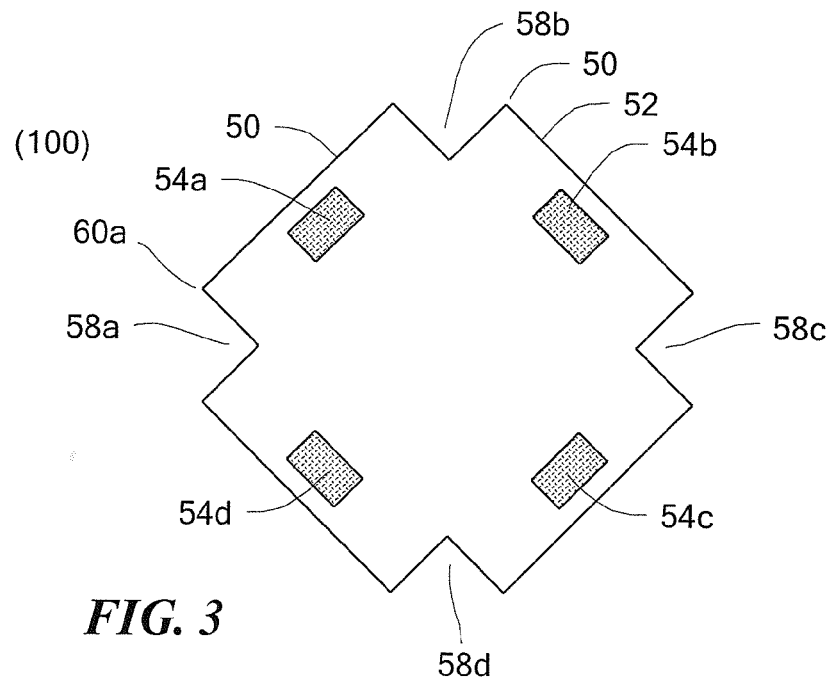
FIG. 3 is top view of a Hall effect element in accordance with the present invention.

Referring now to FIG. 3, an exemplary Hall effect element 50 has a Hall plate 52 with a perimeter and four electrical contacts 54a-54d. The perimeter of the Hall plate 52 has particular regions and characteristics described more fully below in conjunction with FIGS. 3B and 3C.

As will become apparent from discussion below in conjunction with FIG. 4, in a top view, a field plate (not shown) of the Hall effect element 50 in on top of the Hall plate 52. In some embodiments, the perimeter of the Hall plate 52 has essentially the same size and shape as a perimeter of the field plate. Therefore, the entire Hall effect element 50 that includes the Hall plate 52 having the perimeter and the features described below in conjunction with FIGS. 3B and 3C can apply to the perimeter of the Hall plate (epi region) and to the perimeter of the field plate.

In some other embodiments, a perimeter of the field plate can have a shape different than that of the perimeter of the Hall plate. For those embodiments, it is the perimeter of the Hall plate, i.e., epi region, that has the features described above and also below in conjunction with FIGS. 3A-3C, and the field plate can have a perimeter with a different shape.

In some embodiments, the Hall effect element 50 can be fabricated on an n-type silicon substrate (not shown), known to have higher mobility than a p-type substrate and known to result in a higher sensitivity Hall effect element.

The perimeter of the Hall plate 52 can be representative of both a perimeter of the Hall plate, i.e., epi region, and also a perimeter of the field plate. A boundary 56 is representative of a field oxide extension beyond the edge of the perimeter of the Hall plate 52.

The electrical contacts 54a-54c are contact structures in electrical communication with the Hall plate. Metal structures (i.e., pickups) in electrical communication with the electrical contacts may be deposited over the electrical contacts 54a-54c. The metal pickups can each have a larger or smaller size and a different shape than similar characteristics of the electrical contacts 54a-54c.

Dimensions and spacings of electrical contacts are described herein. It will be understood from discussion below in conjunction with FIG. 4 that dimensions and spacing of the electrical contacts need not be exactly the same as similar aspects of the metal pickups.

The substrate upon which the Hall effect element 50 is formed has a so-called Miller index (110) (i.e., plane) that characterizes a direction of crystalline structures within the substrate. Miller indices and Miller directions are known and are not further taught herein.

It is known that electrical currents tend to favor a direction of travel in a substrate. In other words, in particular directions of flow relative to a crystalline structure of a substrate, a substrate has lowest plate resistance. For this reason and for additional reasons described below, lines joining opposing pairs of the electrical contacts 54a-54d are in particular directions described more fully below.

The perimeter of the Hall plate 52 has four indented regions 58a-58c, which form inner corners. The perimeter of the Hall plate 52 also has eight outer corners 60a-60h. The inner corners 58a-58c each deviate inward toward a center of the Hall effect element 50.

Figure 3A:
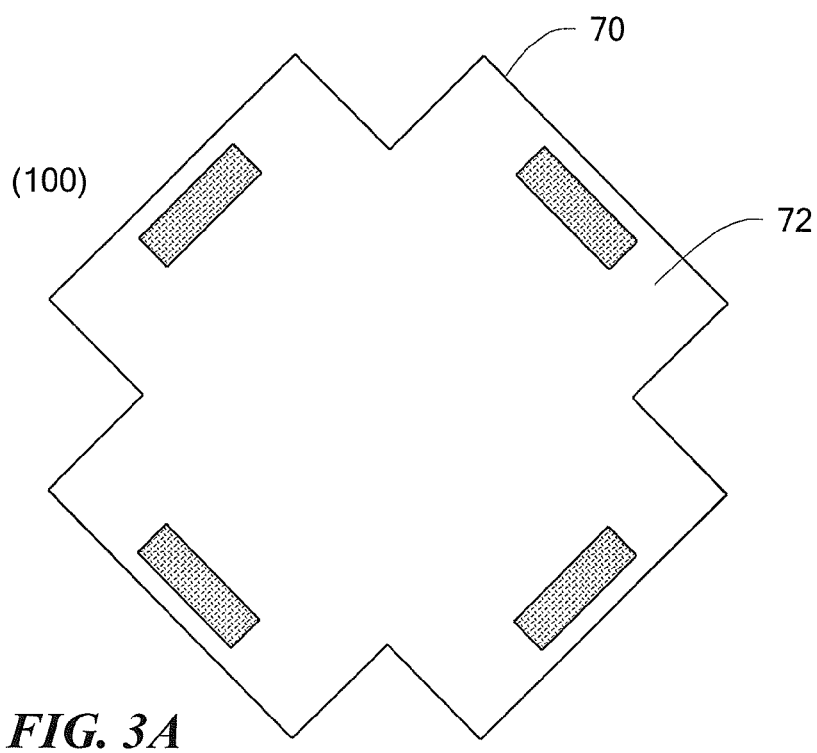
FIG. 3A is top view of the of another Hall effect element in accordance with the present invention.

Referring now to FIG. 3A, another Hall effect element 70 has a Hall plate 72 larger than the Hall plate 52 of FIG. 3. However, the perimeter of the Hall plate 72 has characteristics the same as some characteristics of the Hall plate 52, which characteristics are described below.

In general, it is desirable to form a Hall effect element as small as possible. However, at smaller sizes, offset voltages generated by the Hall effect element tends to increase, which is not desirable. The offset is due, in part, to asymmetries in the structure of the Hall effect element, which asymmetries tend to become more pronounced as the size of the Hall effect element decreases, for reasons of manufacturing tolerances in the shapes and positions of features.

Figure 3B:
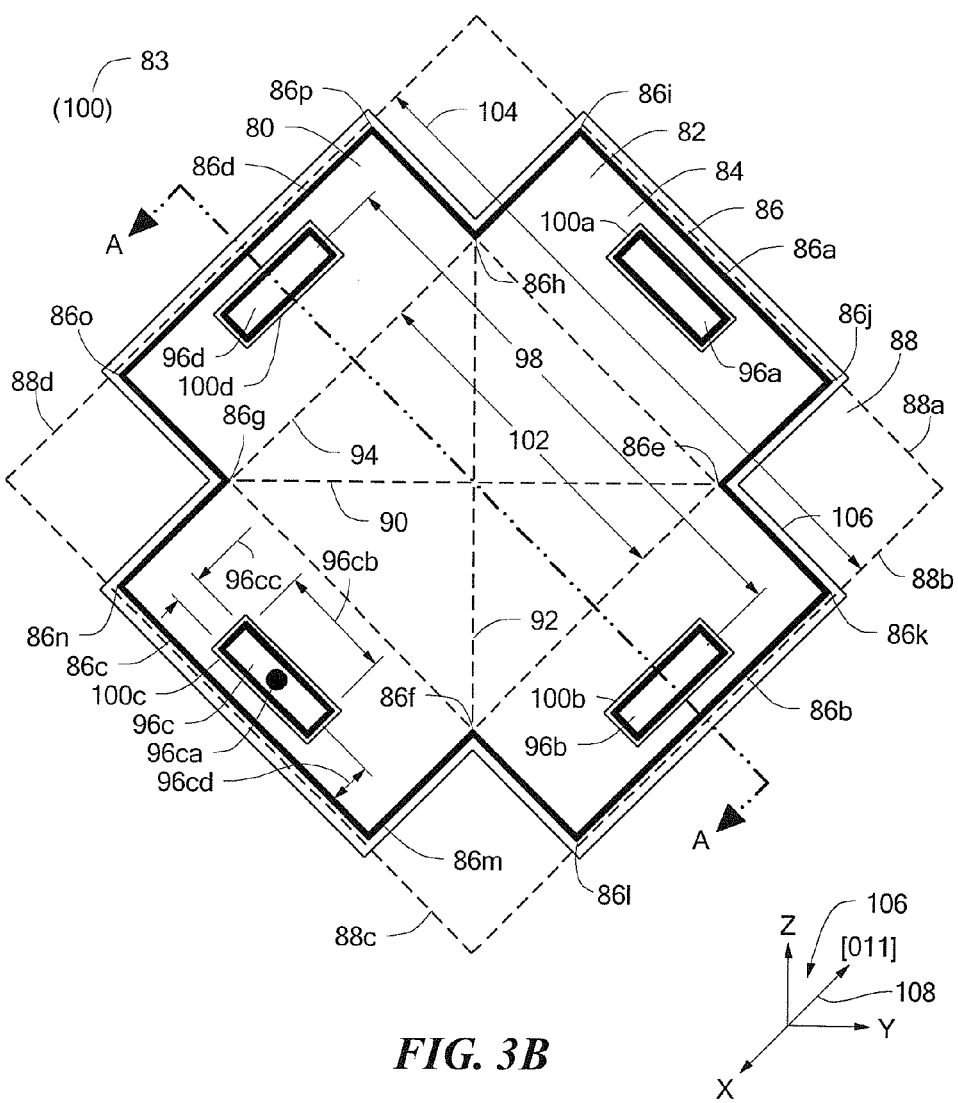
FIG. 3B is top view of the of another Hall effect element in accordance with the present invention and showing particular features and dimensions.

Referring now to FIG. 3B, a Hall plate 82 is representative of the Hall plates 52, 72 described above in conjunction with FIGS. 3 and 3A. The Hall plate 82 can be part of a Hall effect element 80 formed on a substrate.

The Hall effect element 80 includes a substrate comprised of a material with a selected Miller index 83 of (100). The Hall plate 82 is comprised of epi material disposed on a surface of the substrate. The Hall plate 82 includes a major planar surface 84 that has an outer perimeter 86 bounded by a square outer boundary 88. The square outer boundary 88 has four sides 88a-88c with first lengths 104. Four longest sides 86a-86d of the outer perimeter 86 are tangent to the four sides 88a-88d of the square outer boundary 88. Two of the four longest sides 86a-86d of the outer perimeter 86 are parallel to a [011] Miller direction 108 shown in conventional rectangular coordinates 106 (the major planar surface 84 is in the y-z plane) and another different two of the four longest sides 86a-86d of the outer perimeter 86 are orthogonal to the [011] Miller direction 108. The outer perimeter 86 includes four inner corners, each having a respective two orthogonal sides meeting at a respective vertex 86e-86h. For each inner corner, vectors taken along the respective two orthogonal sides and pointing toward the respective vertex 86e-86h point inward toward the Hall plate 82. A first line 90 taken between vertices of a first pair of opposing inner corners is at an angle of forty five degrees relative to the [011] Miller direction and a second line 92 taken between vertices of a second pair of opposing inner corners is orthogonal to the first line 90. The major planar surface 84 further includes a square core region 94 bounded by lines joining adjacent ones of the vertices 86e-86h of the four inner corners. The square core region 94 has four sides with second lengths 102. The major planar surface 84 also includes four electrical contacts 96a-96d. Each electrical contact 96a-96d is in electrical communication with the Hall plate 82.

Each electrical contact, e.g., 96c, has a respective center, e.g., 96ca, a respective length, e.g., 96cc and a respective width, e.g., 96cb. A third line and a fourth line drawn between the centers of respective opposing ones of the electrical contacts, e.g., 96b, 96d, have third lengths, e.g., 98. The third line is parallel to the [011] Miller direction 108 and the fourth line is orthogonal to the third line. A first ratio corresponding to the third lengths, e.g., 104, divided by the second lengths, e.g., 102, is in a range of about 1.1 to about 1.4. In one particular embodiment, the first ratio is 1.333.

Figure 2:
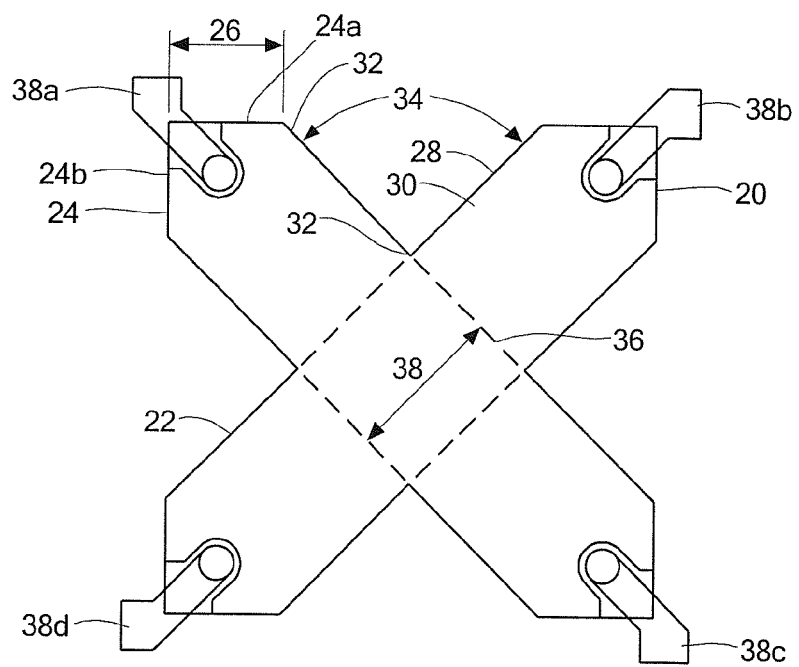
FIG. 2 is top view of a conventional cross-shaped Hall effect element.

It will be understood that the first ratio is one aspect that makes the perimeter 84 of the Hall plate 82 not have the shape of the simple cross of FIG. 2. Instead, the shape is that of a so-called "wide cross." The wide cross shape has particular advantages described more fully below.

Essentially, in one aspect, the shape of the perimeter 84 has much thicker arms than the simple cross of FIG. 2. In another aspect, the electrical contacts 96a-96d are arranged at centers of sides of the wide cross shape, unlike the simple cross 20 of FIG. 2 for which the electrical contacts are arranged at outer corners of the simple cross shape. In another aspect, the first ratio described above results in the inner corners 86e-86h having a particular depth, less deep than inner corners of the simple cross 20 of FIG. 2.

Each electrical contact has a spacing (e.g., 96cd) from the center of the electrical contact to a closest edge of the Hall plate.

A boundary 106 can be representative of an opening in a filed oxide layer in which the Hall effect element 80 is disposed.

The above first ratio and other aspects of the shape of the perimeter 84 described below can be selected to provide a third ratio corresponding to a sensitivity of the Hall effect element in units of microvolts per Gauss divided by a plate resistance in units of kilohms between opposing ones of the electrical contacts greater than or equal to about 4.0.

It will be understood that a higher sensitivity of the Hall effect element 80 is beneficial, since the higher sensitivity tends to result in a higher signal to noise ratio of signals generated by the Hall effect element 80. It will also be understood that a lower plate resistance between opposing ones of the electrical contacts 96a-96d of the Hall effect element 80 tends to be beneficial, since a lower plate resistance contributes to a lower RC time constant, which subsequently result in a Hall effect element capable of a faster speed of operation.

It should be recognized it may not be desirable to achieve the lower plate resistance by higher doping concentrations, since the higher doping concentrations tend to lower sensitivity. It should also be recognized that it may not be desirable to achieve the lower plate resistance by reducing the Hall effect element size too much, since, as described below, a size that is too small can result in high offset voltages.

Figure 1:
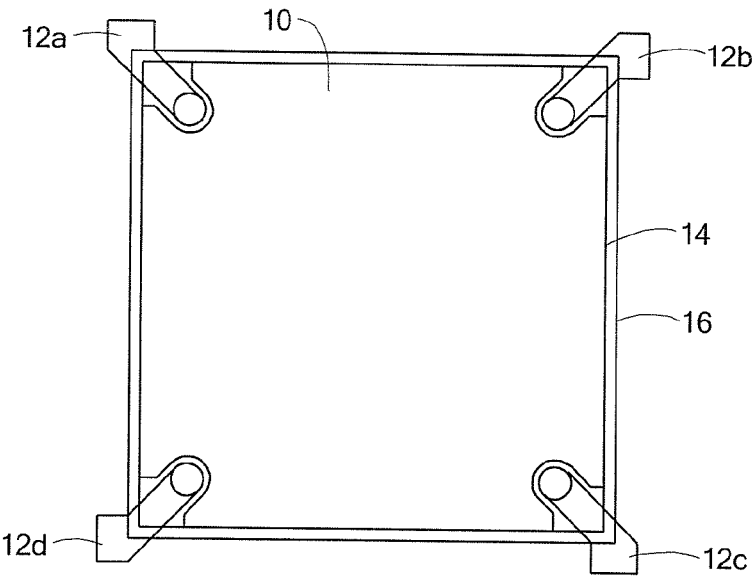
FIG. 1 is top view of a conventional square Hall effect element.

Thus, a high value of the third ratio provides a Hall effect element with superior performance characteristics, superior to the square Hall effect element 10 of FIG. 1 and superior to the simple cross Hall effect element 20 of FIG. 2.

Other characteristics of the Hall effect element described below can also influence the third ratio.

In some embodiments, the Miller index 83 of the substrate is (100) and the Miller direction 108 can be [011]. However, in other embodiments, the substrate can have another Miller index and direction.

The four electrical contacts 96a-96d are disposed at positions such that currents flow between the opposing ones of the electrical contacts in directions parallel to the [011] Miller direction 108 or in directions orthogonal to the [011] Miller direction 108.

In some embodiments, the outer perimeter 86 further comprises eight outer corners 86i-86p, each outer corner having a respective two orthogonal sides meeting at a respective vertex, wherein, for each outer corner, vectors taken along the respective two orthogonal sides and pointing toward the respective vertex point outward from the Hall plate.

In some embodiments, the lengths of the sides of the square core region 94, i.e., the second lengths, are in a range of about 60.0 microns to about 90.0 microns. This parameter sets an overall size of the Hall effect element 80. As described above, it is advantageous to make the Hall effect element as small as possible, but not too small such that offset effects become undesirably large.

Figure 3C:
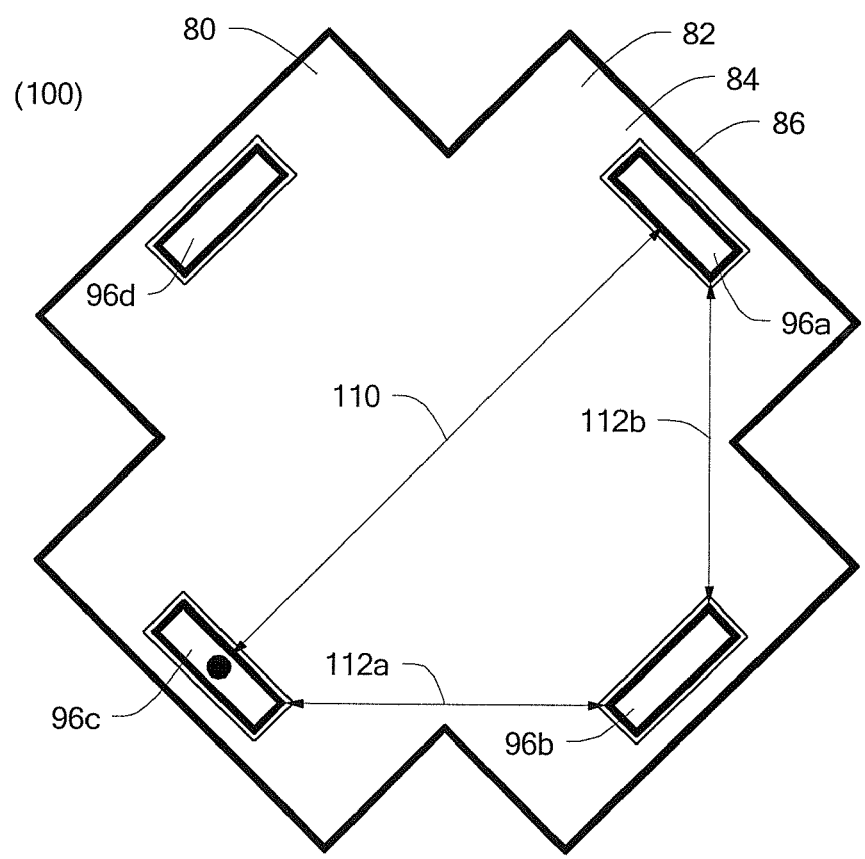
FIG. 3C is top view of the of another Hall effect element in accordance with the present invention and showing other particular dimensions.

Referring now to FIG. 3C, in which like elements of FIG. 3B are shown having like reference designations, in some embodiments, nearest edges of pairs of opposing ones of the electrical contacts 96a-96d are separated by fourth lengths (e.g., 110), and nearest corners of pairs of adjacent ones of the electrical contacts 96a-96d are separated by fifth lengths (e.g., 112a, 112b). A second ratio corresponding to two times the fifth lengths divided by the fourth length is in a range of about 0.9 to about 1.1. In some embodiments, the second ratio is 1.0.

In operation, when driving the Hall effect element, for example, with a current source, it will be understood that it is advantageous for current flowing through the Hall plate 82 to take a direct path, for example, from the electrical contact 96a to the electrical contact 96c, and not an indirect path from the electrical contact 96a to 96b to 96c. The second ratio results in most of the current flowing directly. In addition, it should be recognized that the above described first ratio, which specifies depths of the inner corners 86e-86h of FIG. 3B, also results in most of the current flowing directly, since indirect currents are partially blocked by the inner corners.

A tradeoff is reached, wherein most of the drive currents flow directly between opposing electrical contacts, and yet resistance between the opposing electrical contacts is much lower than resistances achieved by the simple cross shape of FIG. 2.

Like for the first ratio above, the second ratio can also be selected to provide the highest third ratio corresponding to a sensitivity of the Hall effect element in units of microvolts per Gauss divided by a resistance in units of kilohms between opposing ones of the electrical contacts greater than or equal to about 4.0.

Referring again briefly to FIG. 3B, in some embodiments, lines (e.g., 96cd), between centers of the electrical contacts and adjacent edges of the outer perimeter have sixth lengths in a range of 8.0 to about 10.0 microns, wherein the sixth lengths have values selected to result in the highest third ratio.

In some embodiments, the lengths (e.g., 96 cc) and widths (e.g., 96cb) of the electrical contacts 96a-96d are also selected to result in the third ratio greater than or equal to about 4.0. In general, it will be understood that making the electrical contacts 96a-96d wider in the dimension 96cb tends to make the second lengths 112a, 112b smaller, which is undesirable, since more current will flow indirectly between opposing electrical contacts, making the Hall effect element less sensitive. However, making the electrical contacts 96a-96d too narrow will result in higher resistance between opposing pairs of electrical contacts.

Any of the parameters not numerically specified above and which contribute to the third ratio can be easily determined empirically, by constructing a plurality of Hall effect elements on a substrate with ranges of the parameters of interest and selecting best parameters to increase the third ratio.

Figure 4:
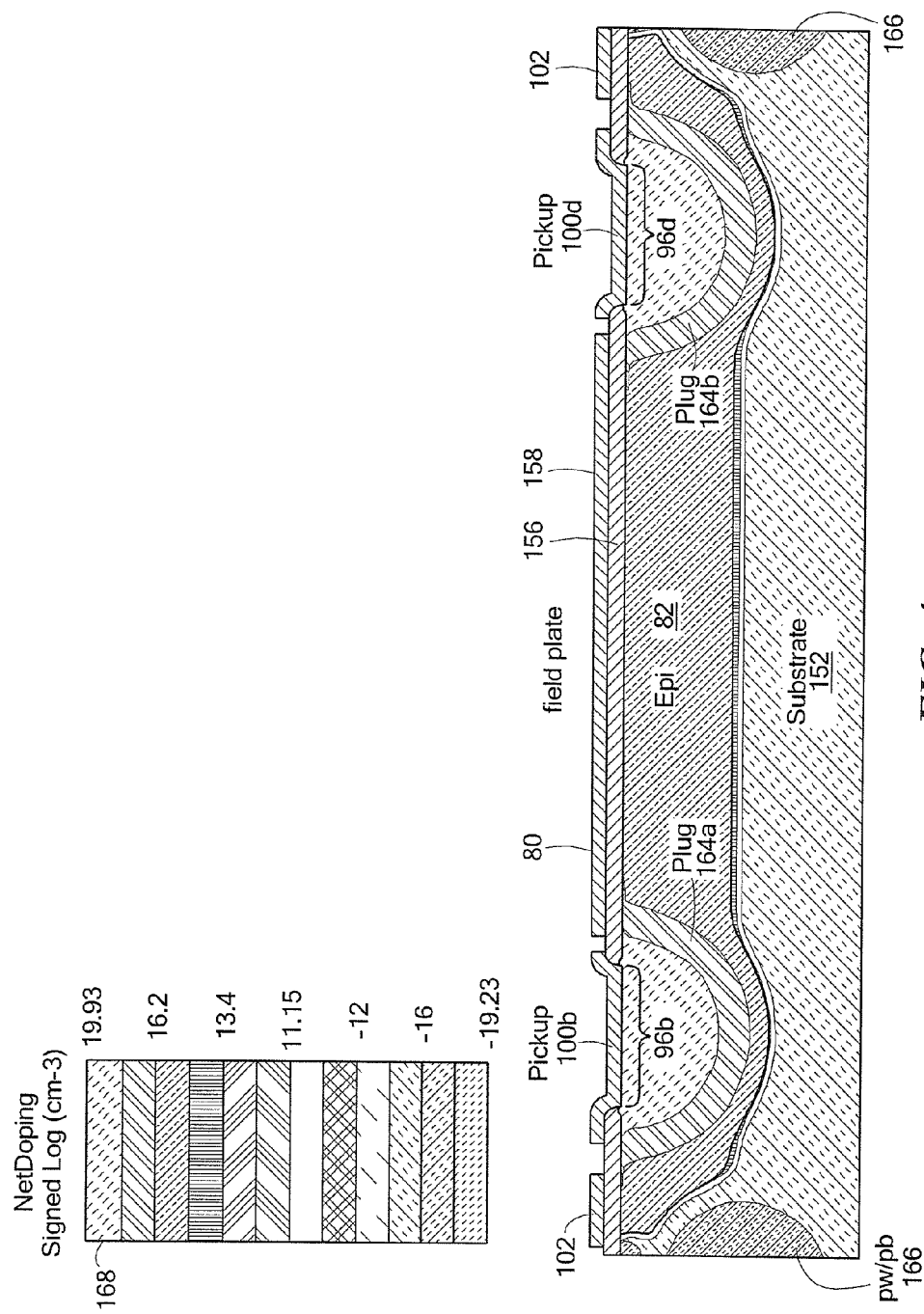
FIG. 4 is a cross-sectional view of the Hall effect elements of FIGS. 3-3C.

Referring now to FIG. 4, in which like elements of FIG. 3B are shown having like reference designations, a cross section of the Hall effect element 80 of FIG. 3B is taken along a section line A-A of FIG. 3B. The Hall plate 82 (also referred to herein as an epi region) is disposed over a substrate 152, for example, a p-type silicon substrate. As represented in a doping scale 168, the Hall plate 154 can have an n-type doping in a range of approximately $7 \times 10^{15}$ to $1.5 \times 10^{16}$ atoms per cm$^3$, for example, arsenic atoms per cm$^3$.

While a silicon substrate is described above, in other embodiments, the substrate 152 is comprised of a selected one of Si, GaAs, SiGe, InGaAs, and AlInGaAs.

In some embodiments, an additional n-well implant can be applied to the Hall plate, i.e., to the epi region, with an n-type doping in a range of approximately $7 \times 10^{16}$ to $1.5 \times 10^{17}$ atoms per cm$^3$, for example, phosphorous atoms per cm$^3$. The n-well doping can result in lower plate resistance, but at the sacrifice of some sensitivity to magnetic fields.

A field plate 158 is disposed over the Hall plate 82. An isolation layer 156 is disposed between the Hall plate 82 and the field plate 158. In some embodiments, the field plate 158 is comprised of a metal, for example, Aluminum, and in other embodiments, the field plate is comprised of polysilicon.

As described above, it is primarily the Hall plate 82 that has the perimeter 84 having the various shape features described above in conjunction with FIGS. 3-3B. However, the field plate 158 can also have the perimeter 86 with the same shape as the perimeter 86 of the Hall plate 82.

The Hall effect element 80 can be electrically isolated by a p-type well 166 extending all around the Hall effect element 80. The p-type well 166 can have a p-type doping in a range of approximately $7 \times 10^{14}$ to $1.5 \times 10^{15}$ atoms per cm$^3$, for example, boron atoms per cm$^3$ The Hall effect element 80 can include the electrical contacts 96b, 96d, and also two other electrical contacts not visible in this cross section. Each of the electrical contacts 96b, 96d is surrounded by a respective plug region 164a, 164b. The electrical contacts 96b, 96d and the plug regions 164a, 164b can be formed by respective n-type doping.

The metal pickups 100b, 100d of FIG. 3C are disposed over the electrical contacts 96b, 96d.

When referring above to dimensions and spacing of the electrical contacts, it is particular surfaces of the electrical contacts 96b, 96d as shown by braces, in electrical communication with the metal pickups 100b, 100d, that are meant. It will be appreciated that these surfaces can be smaller than the associated openings in the isolation layer 156.

In some embodiments, the substrate 152 is comprised of silicon and in other embodiments, the substrate 152 is comprised of gallium arsenide. For embodiments in which the substrate 152 is comprised of gallium arsenide, there may be small structural differences in the layered structure of the Hall effect element, which will be understood by those of ordinary skill in the art. However, a similar Hall effect element can be fabricated using a variety of substrate materials, including, but not limited to, Si, SiGe, GaAs, InGaAs, and AlInGaAs.

As used herein, the term "about" refers to being within five percent of a stated value.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A Hall effect element, comprising:
    a substrate comprised of a material with a selected Miller index of (100) plane;
    a Hall plate comprised of epi material disposed on a surface of the substrate, wherein the Hall plate comprises:
        a major planar surface comprising:
            an outer perimeter bounded by a square outer boundary, wherein the square outer boundary has four sides with first lengths, wherein four longest sides of the outer perimeter are tangent to the four sides of the square outer boundary, wherein two of the four longest sides of the outer perimeter are parallel to a [011] Miller direction and another different two of the four longest sides of the outer perimeter are orthogonal to the [011] Miller direction, wherein the outer perimeter comprises:
                four inner corners, each having a respective two orthogonal sides meeting at a respective vertex, wherein, for each inner corner, vectors taken along the respective two orthogonal sides and pointing toward the respective vertex point inward toward the Hall plate, wherein a first line taken between vertices of a first pair of opposing inner corners is at an angle of forty five degrees relative to the [011] Miller direction and a second line taken between vertices of a second pair of opposing inner corners is orthogonal to the first line, wherein the major planar surface further comprises:
            a square core region bounded by lines joining adjacent ones of the vertices of the four inner corners, wherein the square core region has four sides with second lengths; and
            four electrical contacts, each electrical contact in electrical communication with the Hall plate, each electrical contact having a respective center, a respective length and a respective width, wherein a third line and a fourth line drawn between the centers of respective opposing ones of the electrical contacts have third lengths, wherein the third line is parallel to the Miller direction and the fourth line is orthogonal to the third line, wherein a first ratio corresponding to the third lengths divided by the second lengths is in a range of about 1.1 to about 1.4.

2. The Hall effect element of claim 1, wherein the four electrical contacts are disposed at positions such that currents flow between the opposing ones of the electrical contacts in directions parallel to the [011] Miller direction or in directions orthogonal to the [011] Miller direction.

3. The Hall effect element of claim 1, wherein nearest edges of pairs of opposing ones of the electrical contacts are separated by fourth lengths, wherein nearest corners of pairs of adjacent ones of the electrical contacts are separated by fifth lengths, and wherein a second ratio corresponding to two times the fifth lengths divided by the fourth lengths is in a range of about 0.9 to about 1.1.

4. The Hall effect element of claim 3, wherein the first ratio and the second ratio are selected to provide a third ratio corresponding to a sensitivity of the Hall effect element in units of microvolts per Gauss divided by a resistance in units of kilohms between opposing ones of the electrical contacts greater than or equal to about 4.0.

5. The Hall effect element of claim 4, wherein the second lengths are in a range of about 60.0 microns to about 90.0 microns.

6. The Hall effect element of claim 4, wherein lines between centers of the electrical contacts and adjacent edges of the outer perimeter have sixth lengths in a range of 8.0 to about 10.0 microns, wherein the sixth lengths have values selected to result in a highest third ratio.

7. The Hall effect element of claim 4, wherein lengths and widths of the electrical contacts are selected to result in the third ratio greater than or equal to about 4.0.

8. The Hall effect Element of claim 4, wherein the four electrical contacts are disposed at positions such that currents flow between the opposing ones of the electrical contacts in directions parallel to the [011] Miller direction or in directions orthogonal to the [011] Miller direction.

9. The Hall effect Element of claim 4, wherein the outer perimeter further comprises eight outer corners, each outer corner having a respective two orthogonal sides meeting at a respective vertex, wherein, for each outer corner, vectors taken along the respective two orthogonal sides and pointing toward the respective vertex point outward from the Hall plate.

10. The Hall effect element of claim 4, further comprising four doped plug regions, each disposed under a respective one of the four electrical contacts, wherein each one of the four electrical contacts is in electrical communication with a respective one of the four plug regions.

11. The Hall effect element of claim 4, further comprising a field plate disposed over the Hall plate.

12. The Hall effect element of claim 11, wherein the field plate has a perimeter with substantially the same shape as the perimeter of the Hall plate.

13. The Hall effect element of claim 11, wherein the field plate is comprised of a metal.

14. The Hall effect element of claim 11, wherein the field plate is comprised of a polysilicon.

15. The Hall effect element of claim 11, wherein the Hall effect element is disposed over a substrate comprised of silicon.

16. The Hall effect element of claim 11, wherein the Hall effect element is disposed over a substrate comprised of a selected one of Si, GaAs, SiGe, InGaAs, and AlInGaAs.

17. The Hall effect element of claim 11, wherein the Hall plate comprises an n-well.

* * * * *

UNITED STATES PATENT AND TRADEMARK OFFICE
CERTIFICATE OF CORRECTION

Page 1 of 1

PATENT NO. : 8,357,983 B1
APPLICATION NO. : 13/198303
DATED : January 22, 2013
INVENTOR(S) : Yigong Wang It is certified that error appears in the above-identified patent and that said Letters Patent is hereby corrected as shown below:

In the Specification

Column 3, line 27 delete "of the of another" and replace with --of another--.

Column 3, line 29 delete "of the of another" and replace with --of another--.

Column 3, line 32 delete "of the of another" and replace with --of another--.

Column 4, line 29 delete "58a-58c" and replace with --58a-58d--.

Column 4, line 56 delete "88a-88c" and replace with --88a-88d--.

In the Claims

Column 8, line 54, Claim 1 delete "parallel to the Miller" and replace with --parallel to the [011] Miller--.

Signed and Sealed this
Eighteenth Day of August, 2015

Michelle K. Lee
*Director of the United States Patent and Trademark Office*